United States Patent
Yang et al.

(10) Patent No.: US 7,238,590 B2
(45) Date of Patent: Jul. 3, 2007

(54) PACKAGE STRUCTURE OF SEMICONDUCTOR AND WAFER-LEVEL FORMATION THEREOF

(75) Inventors: Kuo-Pin Yang, Kao-Hsiung Hsien (TW); Wei-Min Hsiao, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 30 days.

(21) Appl. No.: 11/164,818

(22) Filed: Dec. 7, 2005

(65) Prior Publication Data

US 2006/0216859 A1   Sep. 28, 2006

(30) Foreign Application Priority Data

Mar. 25, 2005  (TW) .............................. 94109372 A

(51) Int. Cl.
*H01L 21/44* (2006.01)
*H01L 21/48* (2006.01)
*H01L 21/50* (2006.01)

(52) U.S. Cl. ..................... 438/455; 438/108; 438/109

(58) Field of Classification Search ................ 438/118, 438/119, 108, 455, 456, 459, 109; 257/E21.001, 257/E21.023, E21.499, E21.506
See application file for complete search history.

(56) References Cited

U.S. PATENT DOCUMENTS

| | | | | |
|---|---|---|---|---|
| 5,611,140 A | * | 3/1997 | Kulesza et al. ................ | 29/832 |
| 5,966,593 A | * | 10/1999 | Budnaitis et al. ............ | 438/118 |
| 6,022,761 A | * | 2/2000 | Grupen-Shemansky et al. ........................... | 438/125 |
| 2003/0087475 A1 | * | 5/2003 | Sterrett et al. .............. | 438/108 |

* cited by examiner

*Primary Examiner*—Theresa Doan
*Assistant Examiner*—Sarah K. Harding
(74) *Attorney, Agent, or Firm*—Winston Hsu

(57) ABSTRACT

In wafer-level formation of a package structure of semiconductor, multitudes of conductive connection structures are formed protruded from a transparent substrate. Multitudes of grooves are formed in a semiconductor wafer and an adhesive is filled therein. The wafer and the transparent substrate are jointed in which each of the conductive connection structures are positioned in one of the grooves and exposed outside of another surface of the semiconductor wafer. A package structure is obtained by sawing the wafer and has electrical connection between the signals of the active side and back side through the conductive connection structures.

9 Claims, 6 Drawing Sheets

PACKAGE STRUCTURE OF SEMICONDUCTOR AND WAFER-LEVEL FORMATION THEREOF

BACKGROUND OF THE INVENTION

1. Field of the Invention

The invention relates to a package structure and wafer-level fabrication thereof, and more particularly, to a package structure of integrating micro-electromechanical systems and image chips and wafer-level fabrication thereof.

2. Description of the Prior Art

The development of semiconductor processes has stimulated the progression of image sensor devices, such as complementary metal-oxide semiconductor (CMOS) sensors. In contrast to charged coupled device (CCD) sensors, CMOS sensors have the advantage of small size and cheap price even after being processed through the packaging process. However, ways to significantly increase the variability of designs and application of the CMOS sensors while maintaining the basic architecture has become a critical task. Additionally, ways to decrease the fabrication cost of the CMOS sensor package and apply the sensors to lower priced products has become another important factor.

Currently, the integration of micro-electromechanical systems (MEMS) and CMOS sensors into a package device has become an important technique in miniaturized packages, in which the operating space for micro-electromechanical systems has to be taken into great consideration. Hence, ways to lower the cost of fabricating an integrated package structure has become a critical matter.

SUMMARY OF THE INVENTION

It is therefore an objective of the present invention to provide a package structure and wafer-level process for fabricating the same, in which a conductive structure formed on a substrate is utilized to penetrate another wafer, such that the electrical signals from one surface of the wafer can be transmitted to another surface of the wafer, thereby increasing the packaging flexibility of the micro-electromechanical devices and the image sensors.

It is another aspect of the present invention to provide a package structure of integrated chips and wafer-level process for fabricating the same, in which the package structure fabricated by penetrating a wafer is formed to reduce the complexity of the fabrication process and increase the overall yield.

Preferably, the package structure includes a semiconductor device having an active surface and a back surface, in which the active surface of the semiconductor device faces a substrate; a plurality of conductive connection structures disposed between the substrate and the semiconductor device and on the edge of the semiconductor device; a compliant layer on the back surface that exposes each conductive connection structure; a circuit layer on the compliant layer that contacts each conductive connection structure; and an insulating layer on the circuit layer that exposes part of the circuit layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
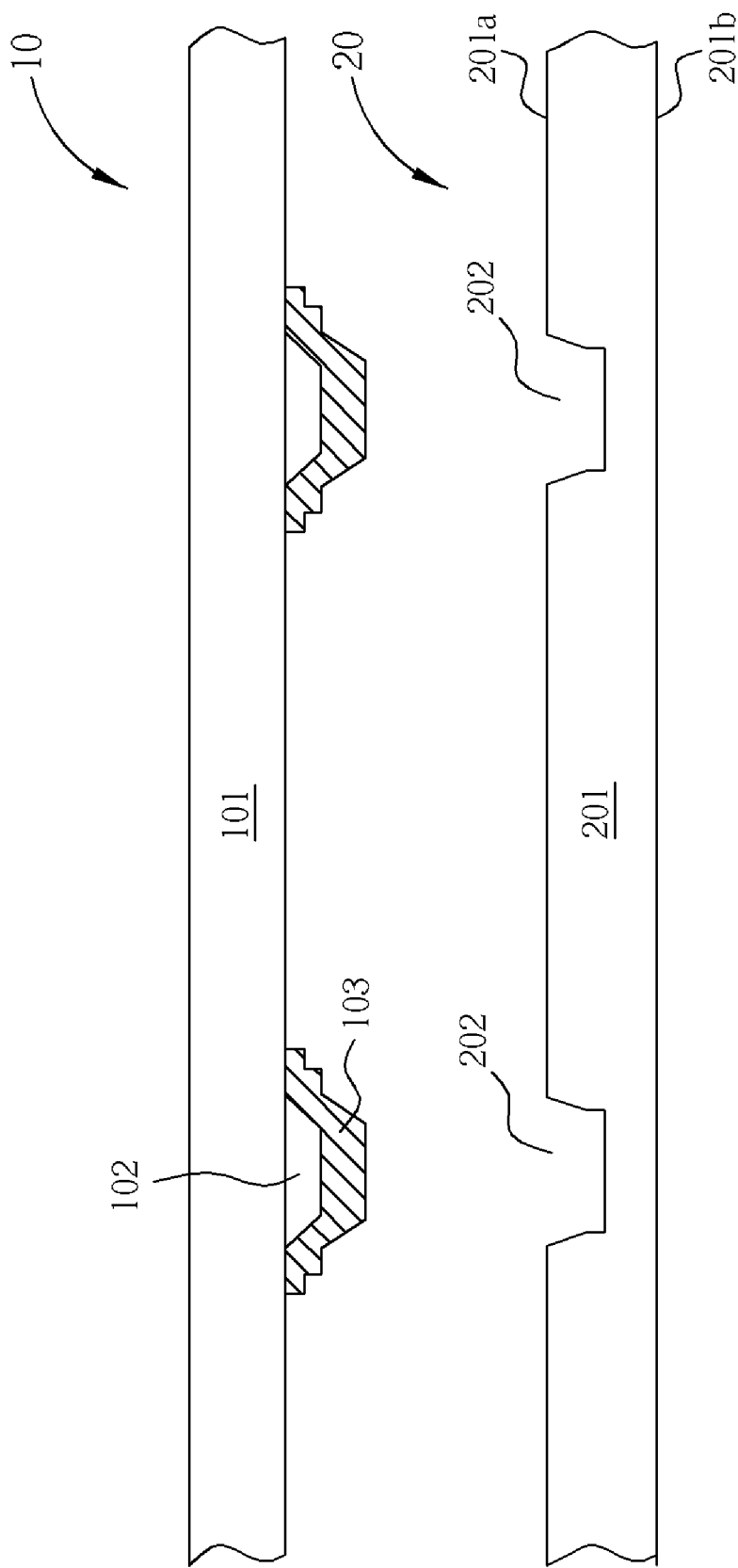
FIG. 1 is a cross-section diagram of a transparent substrate and a semiconductor wafer according to an embodiment of the present invention.

Please refer to FIG. 1. FIG. 1 is a cross-section diagram of a transparent substrate and a semiconductor wafer according to an embodiment of the present invention. As shown in FIG. 1, a substrate 10 is provided, in which the substrate 10 includes a transparent substrate 101, such as a glass substrate, and a plurality of conductive connection structures formed on the transparent substrate 101. Preferably, a dry etching process is first preformed to form a plurality of grooves (not shown) on the transparent substrate 101, and a plurality of center structures 102 is formed thereafter by forming numerous protrusions by benzocyclobutene (BCB) on the transparent substrate 101. Subsequently, an electroplating process is performed to form a conductive layer 103 on the center structures 102 for forming the trace of the conductive connection structure.

Additionally, a wafer 20 includes a semiconductor substrate 201, a plurality of grooves 202 formed on an active surface 201a of the semiconductor substrate 201, and a back surface 201b on the corresponding opposite side of the active surface 201a. Preferably, the semiconductor substrate 201 is a substrate having optical chips or micro-electromechanical chips, and the grooves 202 are fabricated on the wafer scribe lines of the active surface 201 by utilizing conventional methods. Moreover, each groove 202 is located corresponding to each of the conductive connection structures, such that each conductive connection structure is positioned on the wafer scribe lines.

Figure 2:
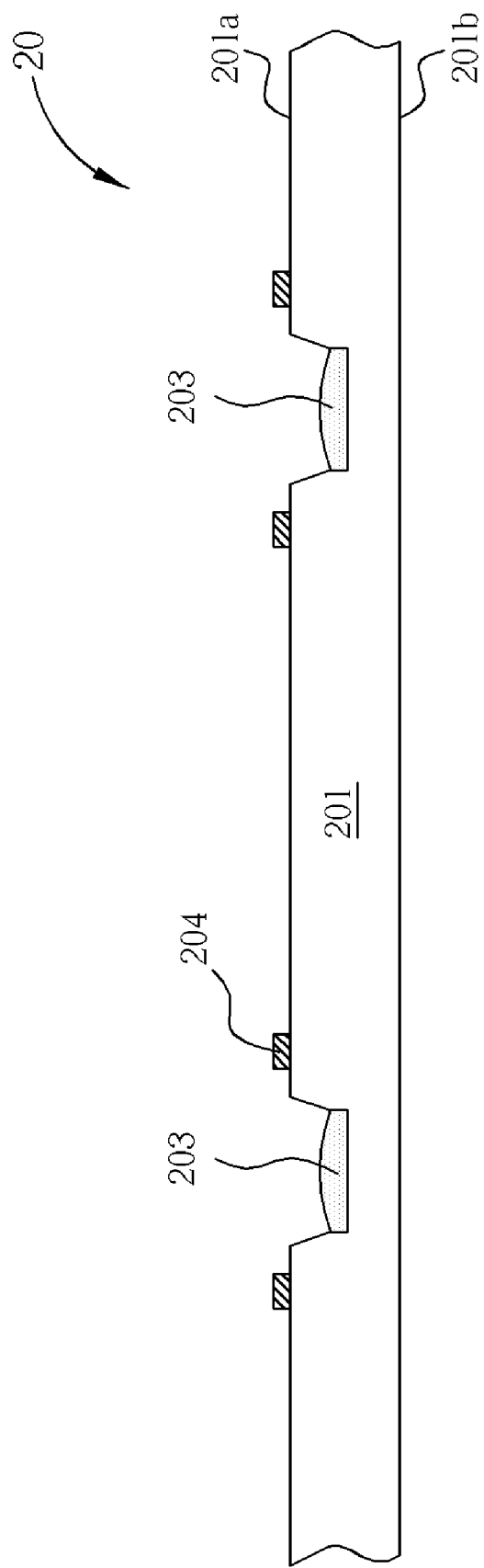
FIG. 2 is a cross-section diagram showing the processing of the semiconductor wafer according to an embodiment of the present invention.

Please refer to FIG. 2. FIG. 2 is a cross-section diagram showing the processing of the semiconductor wafer according to an embodiment of the present invention. As shown in FIG. 2, an adhesive 203 is disposed in each of the grooves 202 for attaching each conductive connection structure of the substrate 10 in a later process. Preferably, the adhesive 203 is composed of a common adhesive material, such as epoxy, in which the quantity of the adhesive 203 may vary but is controlled at the amount that will not overflow to the active surface 201a in the later process. Next, an electroplating process is performed to form a plurality of bumps 204 on the area surrounding the grooves 202, in which the bumps 204 are utilized to adjust the joining and facilitate the electrical connection of the transparent substrate and the wafer in the later process. Preferably, the bumps 204 can be formed in the same process as the formation of the conductive layer 103, in which the depth of the conductive layer 103 can be utilized to adjust the joining and facilitate the electrical connection between the transparent substrate and the wafer thereafter.

Figure 3:
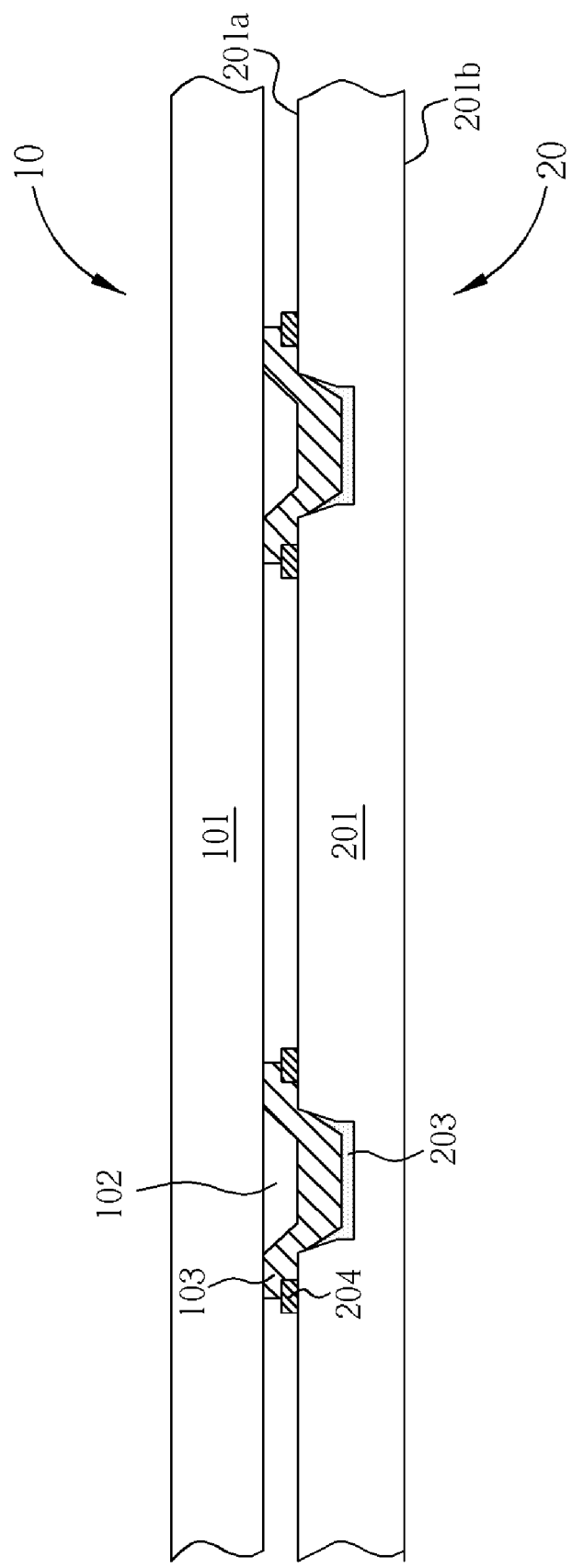
FIG. 3 is a cross-section diagram showing the joining of the transparent substrate and the semiconductor wafer according to an embodiment of the present invention.

Please refer to FIG. 3. FIG. 3 is a cross-section diagram showing the joining of the transparent substrate and the semiconductor wafer according to an embodiment of the present invention. As shown in FIG. 3, the conductive connection structures of the substrate 10 are disposed in the grooves 202 of the active surface 201a of the wafer 20 and into the adhesive 203, in which the surrounding area of the conductive layer 103 contacts the bumps 204. Preferably, the distance between the two wafers is adjusted by the depth of the conductive layer 103 and/or the height of the bumps 204 during the bonding of the substrate 10 and the wafer 20.

Figure 4:
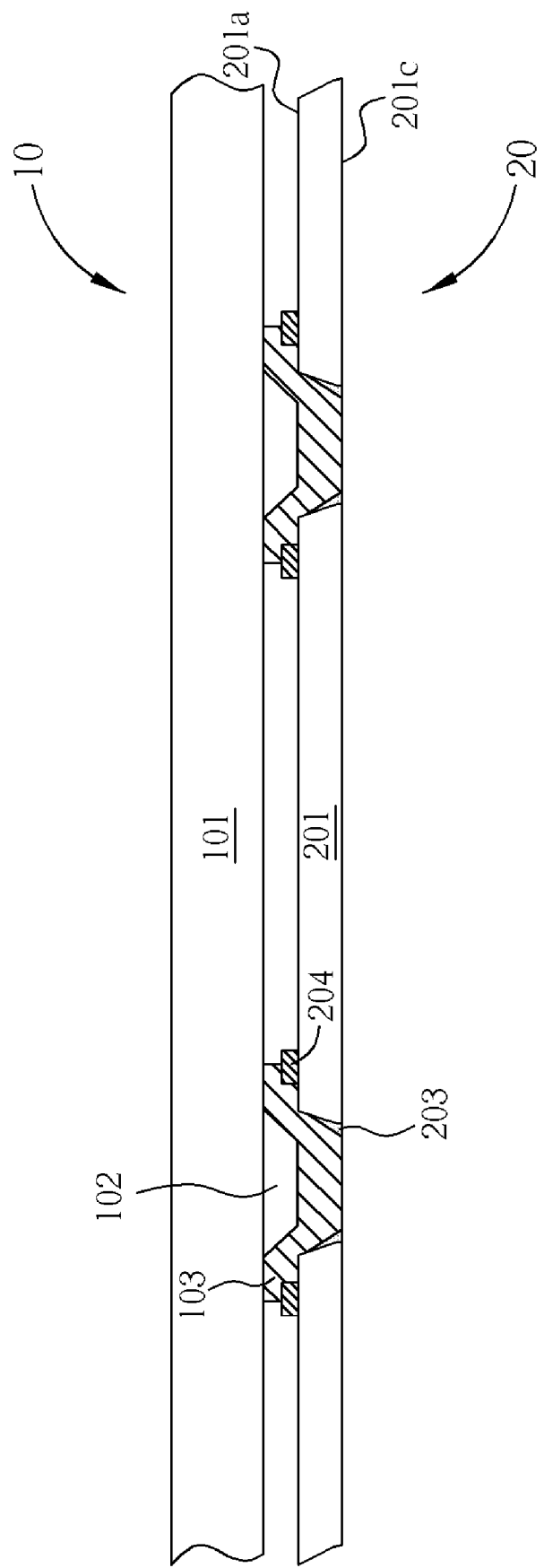
FIG. 4 is a cross-section diagram showing a means of joining and thinning the transparent substrate and the semiconductor wafer according to an embodiment of the present invention.

Please refer to FIG. 4. FIG. 4 is a cross-section diagram showing the means of joining and thinning the transparent substrate and the semiconductor wafer according to an embodiment of the present invention, in which part of the wafer 20 is removed from the back surface 201b for thinning the wafer 20. As shown in FIG. 4, a common planarizing process is performed to thin the wafer 20 that exposes one side of the conductive layer 103 from the thinned back surface 201c. A dry etching process is performed to remove the back surface 201c after the thinning process to form a slight protrusion of the conductive layer 103 from the back surface 201c. By utilizing the conductive connection structures of the substrate 10, the present invention is able to transmit the electrical signals from the conductive trace or the active surface 201a of the wafer 20 to the back surface 201c, and further establish a connection to the redistribution layer and the solder balls in the later process.

Figure 5:
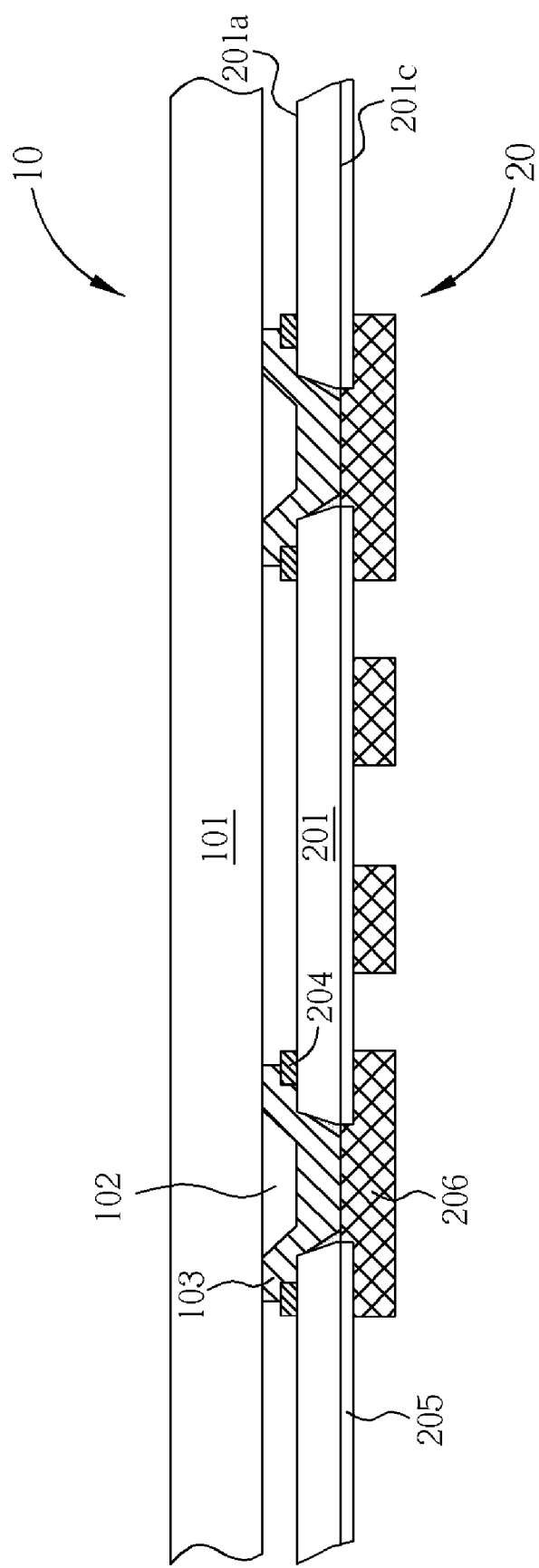
FIG. 5 is a cross-section diagram showing a means of joining the transparent substrate and the semiconductor wafer and fabricating a redistribution layer according to an embodiment of the present invention.

Please refer to FIG. 5. FIG. 5 is a cross-section diagram showing the means of joining the transparent substrate and the semiconductor wafer and fabricating a redistribution layer according to an embodiment of the present invention. As shown in FIG. 5, a compliant layer 205 is first formed on the back surface 201c, and a lithography process is performed to utilize a photoresist to remove a portion of the compliant layer 205 and expose the surface of the conductive layer 103. Next, a conductive layer is formed on the compliant layer 205 and contacting the exposed conductive layer 103, and another photoresist is formed to remove part of the conductive layer and form the circuit layer 206 containing the conductive pads. Preferably, the compliant layer 205, such as a benzocyclobutene (BCB) layer, is utilized to release the stress whereas the circuit layer 206 formed by a sputtering or an electroplating process, is electrically connected to the conductive layer 103 and functioning as the redistribution circuit layer.

Figure 6:
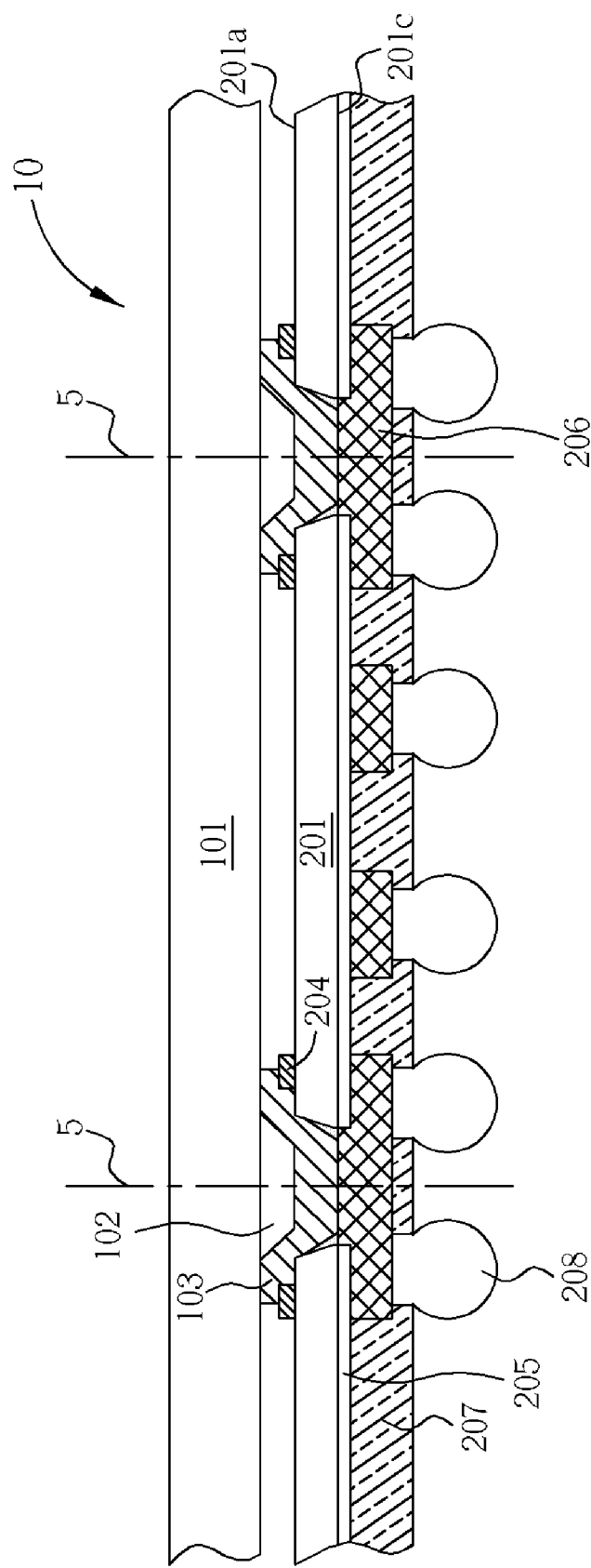
FIG. 6 is a cross-section diagram showing a means of joining the transparent substrate and the semiconductor wafer and fabricating solder balls and performing die singulation according to an embodiment of the present invention.

Please refer to FIG. 6. FIG. 6 is a cross-section diagram showing the means of joining the transparent substrate and the semiconductor wafer and fabricating the solder balls and performing die singulation according to an embodiment of the present invention. As shown in FIG. 6, a coating process is performed to form an insulating layer 207, such as a solder mask on the circuit layer 206 and a lithography process is performed to remove part of the insulating layer 207 for exposing the conductive pads. Next, a solder ball mounting process is performed to dispose a plurality of solder balls 208 on the exposed surface of the conductive pads, in which the solder balls 208 are composed of tin-lead or non-lead materials. Despite the fact that only a circuit layer 206 is shown in the figure for fabricating the redistribution layer, the present invention is able to apply to the fabrication of multiple redistribution layers according to different product designs. Subsequently, a die singulation process is performed to dice the wafer along the scribe center lines 5. Preferably, the conductive layer 103 is positioned corresponding to the scribe center lines 5 and electrically connected to the solder balls 208 by utilizing the circuit layer 206. After the wafer is diced, the signals from the active surface 201a of the dies on the two adjacent side of the scribe center line 5 can be connected to the back surface 201c and further to the solder balls 208 through the conductive layer 103, thereby increasing the design flexibility of the device.

Consequently, the present invention provides a package structure for semiconductors and a wafer-level process for fabricating the same. Preferably, the package structure includes a semiconductor device having an active surface and a back surface, in which the active surface of the semiconductor device faces a substrate; a plurality of conductive connection structures disposed between the substrate and the semiconductor device and on the edge of the semiconductor device; a compliant layer on the back surface and exposes each conductive connection structure; a circuit layer on the compliant layer and contacts each conductive connection structure; and an insulating layer on the circuit layer and exposes part of the circuit layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer-level package process comprising:
   providing a substrate, wherein the substrate comprises a plurality of conductive connection structures protruding from the substrate;
   providing a wafer having an active surface and a back surface, wherein the active surface comprises a plurality of grooves thereon;
   forming an adhesive in each of the grooves;
   joining the substrate and the wafer, wherein each conductive connection structure is positioned in each groove and the adhesive;
   removing part of the wafer from the back surface for exposing each of the conductive connection structures;
   forming a compliant layer on the back surface and exposing each of the exposed conductive connection structures;
   forming at least a circuit layer on the compliant layer, wherein the circuit layer contacts the exposed conductive connection structures; and forming an insulating layer on the circuit layer and exposing part of the circuit layer.

2. The wafer-level package process of claim 1 further comprising forming a plurality of solder balls on the exposed circuit layer.

3. The wafer-level package process of claim 1, wherein the step of providing the substrate comprises:
   providing a transparent substrate;
   forming a plurality of adhesive structures on the transparent substrate; and
   electroplating a conductive layer on each adhesive structure for forming a conductive connection structure.

4. The wafer-level package process of claim 1, wherein the step of providing the wafer comprises utilizing an etching process for forming the plurality of grooves.

5. The wafer-level package process of claim 1, wherein the step of providing the wafer comprises electroplating a plurality of bumps on the active surface.

6. The wafer-level package process of claim 5, wherein the step of joining the substrate and the wafer further comprises utilizing the bumps for contacting the conductive connection structures.

7. The wafer-level package process of claim 1, wherein the step of removing part of the wafer comprises:
   utilizing a chemical mechanical polishing (CMP) process for planarizing the wafer from the back surface; and
   performing a micro-etching process on the planarized back surface.

8. The wafer-level package process of claim 1, wherein the step of forming the insulating layer comprises:
   coating a solder resist on the circuit layer;
   performing a lithography process on the solder resist; and
   removing part of the solder resist for exposing part of the circuit layer.

9. The wafer-level package process of claim 1, wherein the step of forming the adhesive is achieved by utilizing a printing process.

* * * * *